US011711074B2

(12) United States Patent
Wang et al.

(10) Patent No.: US 11,711,074 B2
(45) Date of Patent: Jul. 25, 2023

(54) OPTICAL RECEIVER DEVICE, PULSE WIDTH MODULATION CONTROLLER CIRCUITRY, AND SENSITIVITY CONTROL METHOD

(71) Applicant: REALTEK SEMICONDUCTOR CORPORATION, Hsinchu (TW)

(72) Inventors: Shih-Cheng Wang, Hsinchu (TW); Hsin-Chuan Chen, Hsinchu (TW); Ko-Li Hung, Hsinchu (TW); Hung-Chih Kuo, Hsinchu (TW); Shih-Chieh Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 203 days.

(21) Appl. No.: 17/202,395

(22) Filed: Mar. 16, 2021

(65) Prior Publication Data
US 2021/0391855 A1 Dec. 16, 2021

(30) Foreign Application Priority Data
Jun. 15, 2020 (TW) ................................ 109120097

(51) Int. Cl.
*H04B 10/00* (2013.01)
*H03K 7/08* (2006.01)
(Continued)

(52) U.S. Cl.
CPC .............. *H03K 7/08* (2013.01); *H02M 3/156* (2013.01); *H03M 1/66* (2013.01); *H04B 10/11* (2013.01); *H04B 10/66* (2013.01)

(58) Field of Classification Search
CPC .......... H03K 7/08; H02M 3/156; H03M 1/66; H04B 10/11; H04B 10/66
(Continued)

(56) References Cited

U.S. PATENT DOCUMENTS

| 2004/0159776 A1* | 8/2004 | Richard | ........... H03K 19/00369 |
|---|---|---|---|
| | | | 250/214 R |
| 2008/0266907 A1 | 10/2008 | Kim et al. | |
| 2013/0249421 A1* | 9/2013 | Cavallini | ............... H05B 45/00 |
| | | | 315/193 |

OTHER PUBLICATIONS

OA letter of the counterpart TW application (appl. No. 109120097) dated Apr. 30, 2021. Summary of the OA letter: 1.Claims 1 and 10 are rejected as allegedly being unpatentable over first cited reference (US 2004/0159776A1) in view of second cited refrence (US 2013/0249421A1). 2.Claims 2-6 are rejected as allegdly being unpatentable over the first cited reference in view of second cited refrence, and in further view of third cited reference (US 2008/0266907A1) 3.Claim 7 is rejected as allegdly being anticipated by the second reference. 4.Claims 8-9 are rejected as allegedly being unpatentable over the second cited reference in view of the third cited reference.

\* cited by examiner

*Primary Examiner* — Mohammad R Sedighian
(74) *Attorney, Agent, or Firm* — WPAT, P.C

(57) ABSTRACT

An optical receiver device includes a boost converter circuit, an optical receiver circuit, and a pulse width modulation controller circuitry. The boost converter circuit is configured to convert a supply voltage according to a pulse width modulation signal, in order to generate an output voltage. The optical receiver circuit is configured to set a gain according to the output voltage, in order to convert an optical signal to a data signal according to the gain. The pulse width modulation controller circuitry is configured to perform a digital to analog conversion according to a control code to gradually adjust a current associated with the output voltage, and to compare the output voltage with a reference voltage to generate the pulse width modulation signal.

20 Claims, 5 Drawing Sheets

(51) Int. Cl.
*H03M 1/66* (2006.01)
*H04B 10/11* (2013.01)
*H04B 10/66* (2013.01)
*H02M 3/156* (2006.01)

(58) Field of Classification Search
USPC ........................................................ 398/116
See application file for complete search history.

OPTICAL RECEIVER DEVICE, PULSE WIDTH MODULATION CONTROLLER CIRCUITRY, AND SENSITIVITY CONTROL METHOD

BACKGROUND OF THE INVENTION

1. Field of the Invention

The present disclosure relates to an optical receiver device. More particularly, the present disclosure relates to an optical receiver device having a pulse modulation circuitry that may perform a digital to analog conversion and a sensitivity control method.

2. Description of Related Art

In fiber optical network applications, a photodiode is utilized to convert an optical signal to an electrical signal for subsequent data processing. In an actual long-distance communication, if a light sensitivity of the photodiode is insufficient high or is unstable, it may lower a signal to noise ratio of a received data signal and increase a bit error rate.

SUMMARY OF THE INVENTION

In some embodiments, an optical receiver device includes a boost converter circuit, an optical receiver circuit, and a pulse width modulation controller circuitry. The boost converter circuit is configured to convert a supply voltage according to a pulse width modulation signal, in order to generate an output voltage. The optical receiver circuit is configured to set a gain according to the output voltage, in order to convert an optical signal to a data signal according to the gain. The pulse width modulation controller circuitry is configured to perform a digital to analog conversion according to a control code to gradually adjust a current associated with the output voltage, and to compare the output voltage with a reference voltage to generate the pulse width modulation signal.

In some embodiments, a pulse width modulation controller circuitry, includes a feedback circuit, a digital to analog converter circuit, and a modulator circuitry. The feedback circuit is configured to generate a feedback voltage according to an output voltage, in which the output voltage is generated by a boost converter circuit according to a pulse width modulation signal. The digital to analog converter circuit is configured to perform a digital to analog conversion, in order to gradually adjust a current associated with the output voltage. The modulator circuitry is configured to generate the pulse width modulation signal according to the feedback voltage.

In some embodiments, a sensitivity control method includes the following operations: converting a supply voltage according to a pulse width modulation signal, in order to generate an output voltage; performing a digital to analog conversion according to a control code, in order to gradually adjust a current associated with the output voltage; comparing the output voltage with a reference voltage, in order to generate the pulse width modulation signal; and setting a gain of an optical receiver circuit according to the output voltage, in order to control a sensitivity of the optical receiver circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
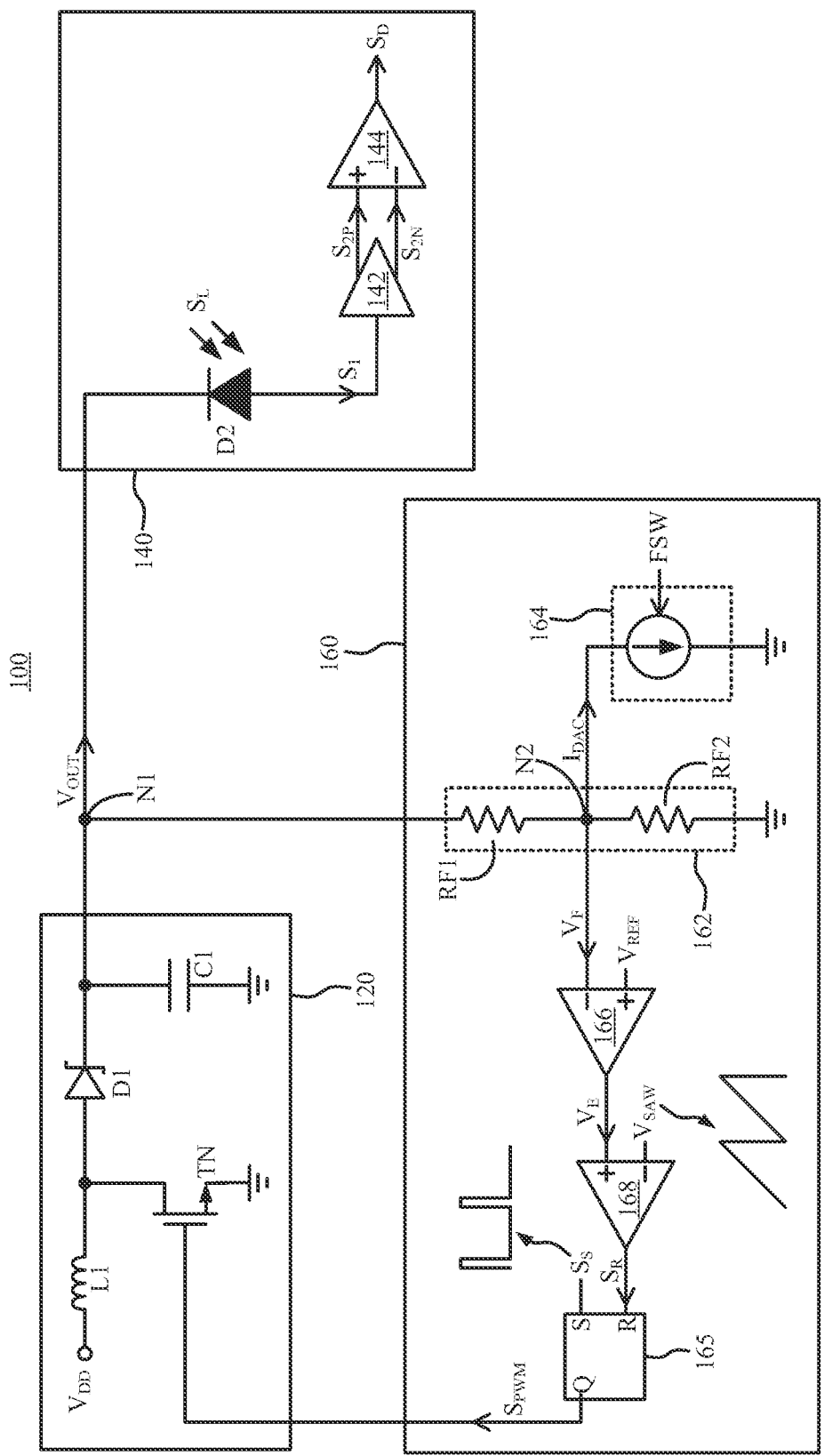
FIG. 1 is a schematic diagram of an optical receiver device according to some embodiments of the present disclosure.

FIG. 1 is a schematic diagram of an optical receiver device 100 according to some embodiments of the present disclosure. In some embodiments, the optical receiver device 100 may be, but not limited to, applied with a fiber optical network.

The optical receiver device 100 includes a boost converter circuit 120, an optical receiver circuit 140, and a pulse width modulation (PWM) controller circuitry (hereinafter referred to as "PWM controller circuitry 160" for simplicity). The boost converter circuit 120 is configured to convert a supply voltage $V_{DD}$ according to a pulse width modulation signal $S_{PWM}$ (hereinafter referred to as "PWM signal $S_{PWM}$" for simplicity), in order to generate an output voltage $V_{OUT}$ from a node N1. For example, the boost converter circuit 120 includes an inductor L1, a transistor TN, a diode D1, and a capacitor C1. A first terminal of the inductor L1 receives the supply voltage $V_{DD}$, a second terminal of the inductor L1 is coupled to a first terminal (e.g., drain) of the transistor TN and an anode of the diode D1. A second terminal (e.g., source) of the transistor TN is coupled to ground, and a control terminal (e.g., gate) of the transistor TN is configured to receive the PWM signal $S_{PWM}$. The transistor TN may be selectively turned on according to the PWM signal $S_{PWM}$. A cathode of the diode D1 is coupled to the node N1 and a first terminal of the capacitor C1 to generate the output voltage $V_{OUT}$, a second terminal of the capacitor C1 is coupled to ground. In this example, the diode D1 may be, but not limited to, a Schottky diode. When the transistor TN is turned on according to the PWM signal $S_{PWM}$, the inductor L1 stores energy based on the supply voltage $V_{DD}$. If a time interval of the transistor TN being turned on gets longer, the inductor L1 stores more energy. When the transistor TN is turned off according to the PWM signal $S_{PWM}$, the inductor L1 transfers the previously stored energy to the capacitor C1 via the diode D1, in order to generate the output voltage $V_{OUT}$.

The optical receiver circuit 140 is a receiver optical sub-assembly (ROSA) module, which may set a gain according to the output voltage $V_{OUT}$, and converts the optical signal $S_L$ to a data signal $S_D$ according to the gain. For example, the optical receiver circuit 140 includes a diode D2, a transimpedance amplifier circuit 142, and a post amplifier circuit 144. A cathode of the diode D2 is coupled to the node N1 to receive the output voltage $V_{OUT}$, and an anode of the diode D2 is configured to generate the signal Si. In this embodiment, the diode D2 may be, but not limited to, an avalanche photodiode, which is reverse biased according to the output voltage $V_{OUT}$. If the output voltage $V_{OUT}$ increases (i.e., the reversed biasing voltage is higher), the gain of the diode D2 increases. As a result, the diode D2 may generate the signal Si having high power in response to the optical signal $S_L$. Alternatively, if the output voltage $V_{OUT}$ decreases (i.e., the reverse biasing voltage is lower), the gain of the diode D2 decreases. As a result, the diode D2 may generate the signal Si having lower power in response to the optical signal $S_L$. In other words, the diode D2 may set the sensitivity of sensing the optical signal $S_L$ (which equals to the gain) based on the output voltage $V_{OUT}$. The transimpedance amplifier circuit 142 may convert the signal Si to be a signal $S_{2P}$ and a signal $S_{2N}$, and the post amplifier circuit 144 may generate the data signal $S_D$ according to the signal $S_{2P}$ and the signal $S_{2N}$.

The PWM controller circuitry 160 is configured to perform a digital to analog conversion according to a frequency switching control code FSW (hereinafter referred to as "control code FSW"), in order gradually adjust a current $I_{DAC}$ associated with the output voltage $V_{OUT}$ and to compare the output voltage $V_{OUT}$ with a reference voltage $V_{REF}$, in order generate the PWM signal $S_{PWM}$. In some embodiments, the control code FSW is for setting a target level of the output voltage Your. For example, as discussed below, the current $I_{DAC}$ is adjusted in response to the control code FSW, in order to adjust the output voltage $V_{OUT}$.

In greater detail, the PWM controller circuitry 160 may include a feedback circuit 162, a digital to analog converter (DAC) circuit 164 (hereinafter referred as "DAC circuit 164" for simplicity), an error amplifier circuit 166, a comparator circuit 168, and a latch circuit 165. The feedback circuit 162 is coupled to the node N1, and is configured to generate the feedback voltage $V_F$ according to the output voltage Your. For example, the feedback circuit 162 includes a resistor RF1 and a resistor RF2. The resistor RF1 is coupled between the node N1 and a node N2, and the resistor RF2 is coupled between the node N2 and ground. The resistor RF1 and the resistor RF2 divide the output voltage Your to generate the feedback voltage $V_F$. In some embodiments, the resistor RF1 may be an off-chip resistor, and the resistor RF2 may be an on-chip resistor, but the present disclosure is not limited thereto. An output terminal of the DAC circuit 164 is coupled to the node N2, in order to generate (e.g., drain) the current $I_{DAC}$. In some embodiments, the current $I_{DAC}$ flows through at least one part of the feedback circuit 162 (which may be, for example, the resistor RF1). In some embodiments, the DAC circuit 164 performs a digital to analog conversion according to the control code FSW to adjust the current $I_{DAC}$, in order to adjust the output voltage $V_{OUT}$ (as shown by the following equation(1)). Detailed operations about the DAC circuit 164 will be given with reference to FIG. 2A to FIG. 2C.

In some embodiments, the error amplifier circuit 166, the comparator circuit 168, and the latch circuit 165 operate as a modulator circuitry that generates the PWM signal $S_{PWM}$ according to the feedback voltage $V_F$. For example, the error amplifier circuit 166 generates an error signal $Y_E$ according to the feedback voltage $V_F$ and the reference voltage $V_{REF}$. The comparator circuit 168 compares the error signal $V_E$ with a saw signal $V_{SAW}$, in order to generate a reset signal $S_R$. The latch circuit 165 may be (but not limited to) a set-reset (SR) latch, which may generate the PWM signal $S_{PWM}$ according to the reset signal $S_R$ and a set signal Ss. With the above arrangement, the output voltage $V_{OUT}$ may be expressed as the following equation (1):

$$V_{OUT} = V_{REF} \times \left(1 + \frac{RF1}{RF2}\right) + RF1 \times I_{DAC} \qquad (1)$$

Based on the equation (1), if the current $I_{DAC}$ increases, the output voltage $V_{OUT}$ increases; otherwise, if the current $I_{DAC}$ decreases, the output voltage $V_{OUT}$ decreases lower. In other words, by adjusting the current $I_{DAC}$, the boost converter circuit 120 may adjust the output voltage $V_{OUT}$ correspondingly.

In some related approaches, if it is required to adjust (i.e., increase or decrease) the output voltage to another target level in a short time, the output voltage may have an overshoot value or a undershoot value due to impacts from capacitor(s) of internal node(s) in the PWM controller and a response time of the negative feedback mechanism. As a result, the gain of the photodiode will be unstable in a period of time.

Compared with the above approaches, in some embodiments of the present disclosure, with the digital to analog conversion of the DAC circuit 164, the current $I_{DAC}$ is gradually increased or decreased. As a result, the boost converter circuit 120 may gradually and linearly increase or decrease the output voltage $V_{OUT}$, in order to prevent the overshoot voltage or the undershoot voltage.

Figure 2A:
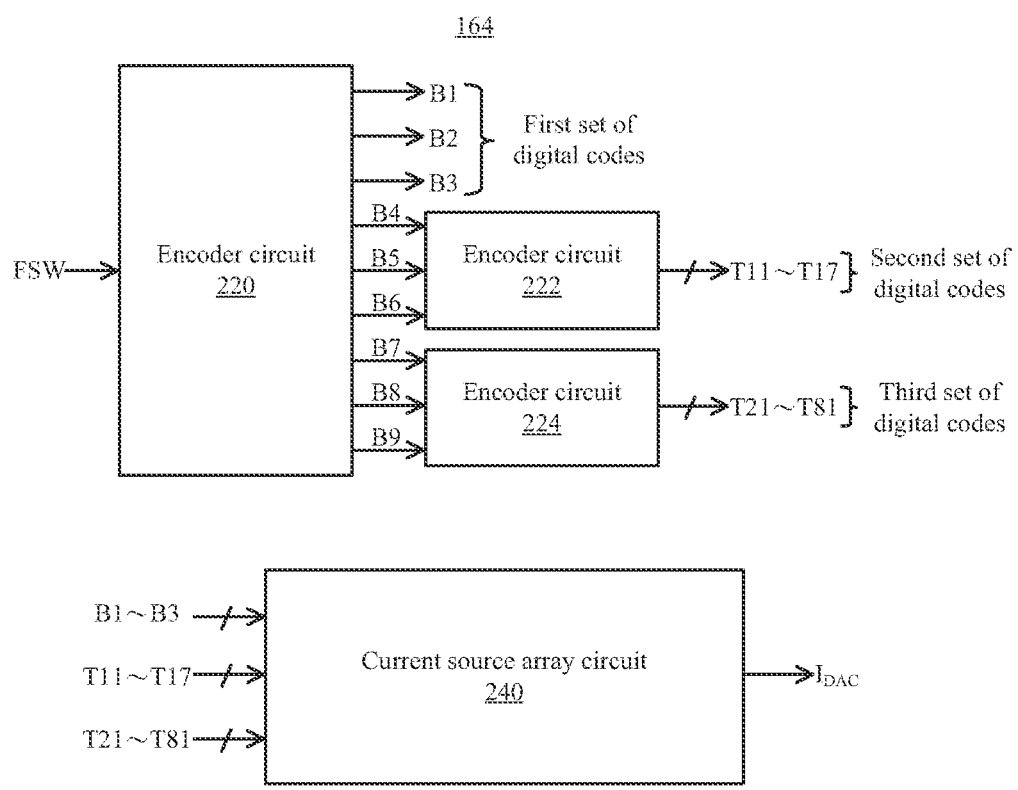
FIG. 2A is a schematic diagram of the DAC circuit in FIG. 1 according to some embodiments of the present disclosure.

FIG. 2A is a schematic diagram of the DAC circuit 164 in FIG. 1 according to some embodiments of the present disclosure. The DAC circuit 164 includes encoder circuits 220, 222, and 224 and a current source array circuit 240. The encoder circuits 220, 222, and 224 generate multiple sets of digital codes according to the control code FSW. In greater detail, the encoder circuit 220 generates bits B1-B9 according to the control code FSW, in which a first portion (e.g., bits B1-B3) of the bits B1-B9 is a first set of digital codes. The encoder circuit 222 generates bits T11-T17 (hereinafter referred to as "a second set of digital codes") according to a second portion of the bits B1-B9 (e.g., bits B4-B6). The encoder circuit 224 generates bits T21-T81 (hereinafter referred to as "a third set of digital codes") according to a third portion of the bits B1-B9 (e.g., bits B7-B9). In some embodiments, each of the control code FSW, the second set of digital codes, and the third set of digital codes is a thermometer code, and the bits B1-B9 are a binary code.

Figure 2B:
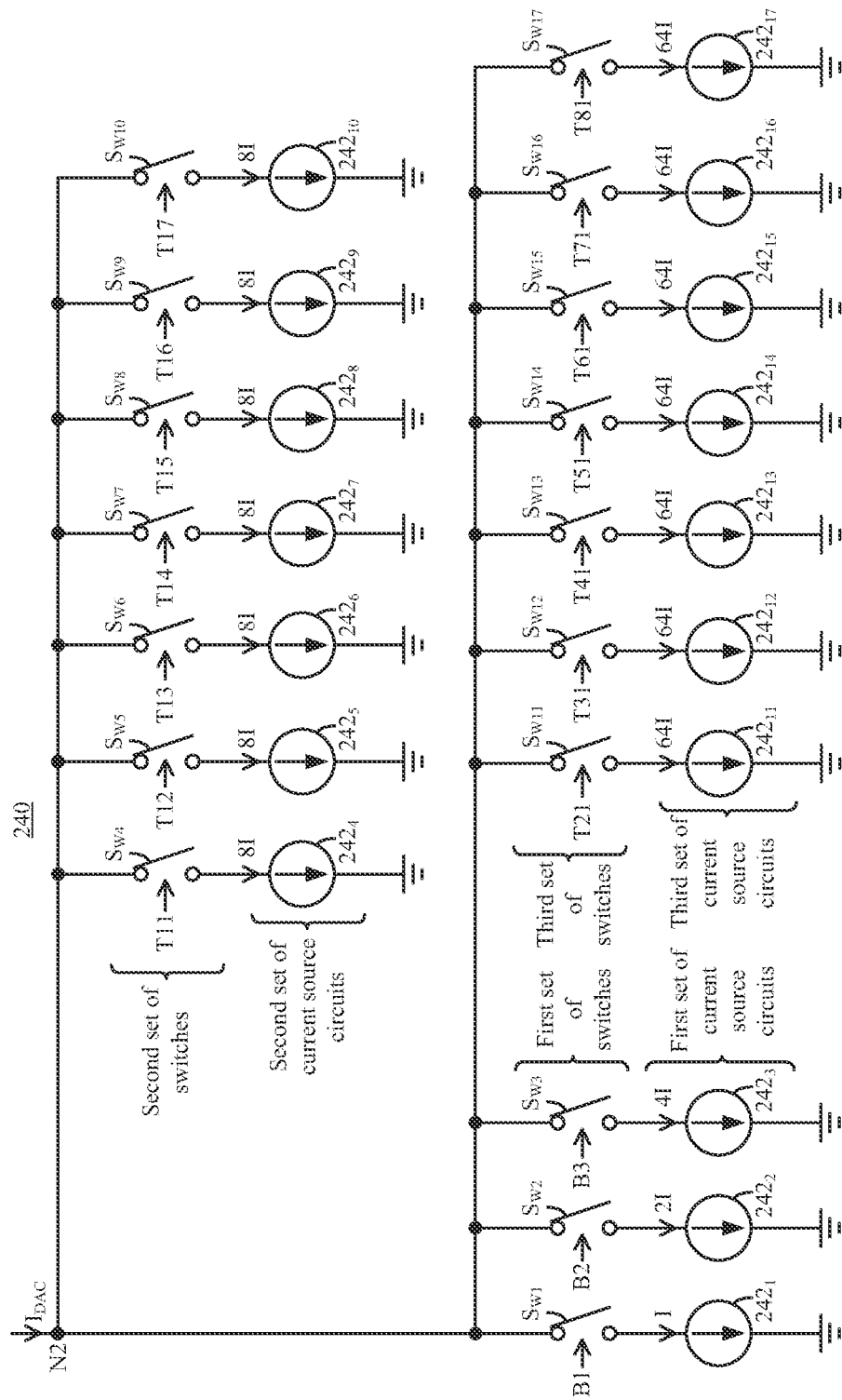
FIG. 2B is a schematic diagram of the current source array circuit in FIG. 2A according to some embodiments of the present disclosure.

As a shown in FIG. 2A, the current source array circuit 240 is configured to be selectively turned on according to the above sets of digital codes, in order to generate the current $I_{DAC}$. For ease of illustrating the current source array circuit 240, reference is made to FIG. 2B, and FIG. 2B is a schematic diagram of the current source array circuit 240 in FIG. 2A according to some embodiments of the present disclosure. The current source array circuit 240 includes switches $S_{W1}$-$S_{W17}$ and current source circuits $242_1$-$242_{17}$. The switches $S_{W1}$-$S_{W3}$ are a first set of switches, the switches $S_{W4}$-$S_{W10}$ are a second set of switches, and the switches $S_{W11}$-$S_{W17}$ are a third set of switches. The current source circuits $242_1$-$242_3$ are a first set of current source circuits, the current source circuits $242_4$-$242_{10}$ are a second set of current source circuits, and the current source circuits $242_{11}$-$242_{17}$ are a third set of current source circuits.

The first set of switches $S_{W1}$-$S_{W3}$, the second set of switches $S_{W4}$-$S_{W10}$, and the third set of switches $S_{W11}$-$S_{W17}$ are controlled by the first set of digital codes, the second set of digital codes, and the third set of digital codes, respectively. For example, the switches $S_{W1}$-$S_{W3}$ are selectively turned on according to the bits B1-B3 respectively, the switches $S_{W4}$-$S_{W10}$ are selectively turned on according to the bits T11-T17 respectively, and the switches $S_{W11}$-$S_{W17}$ are selectively turned on according to the bits T21-T81 respectively.

The first set of current source circuits $242_1$-$242_3$, the second set of current source circuits $242_4$-$242_{10}$, and the third set of current source circuits $242_{11}$-$242_{17}$ are coupled to the first set of switches $S_{W1}$-$S_{W3}$, the second set of switches $242_4$-$242_{10}$, and the third set of switches $S_{W11}$-$S_{W17}$, respectively. Currents of the current source circuits $242_1$-$242_3$ are I, 2I, and 4I respectively. A current of each of the current source circuits $242_4$-$242_{10}$ is 8I. A current of the current source circuit $242_{11}$-$242_{17}$ is 64I. In other words, a current (i.e., 64I) of one current source circuit in the third set of current source circuits $242_{11}$-$242_{17}$ is higher than a total current (i.e., 56I) of the second set of current source circuits, and a current (i.e., 8I) of one current source circuit in the second set of current sources is higher than a total current (i.e., 7I) of the first set of current source circuits $242_1$-$242_3$.

Explained in a different way, the first set of digital codes (i.e., the bits B1-B3) is generated according to bits having lower weights in the control code FSW, the second set of digital codes (i.e., the bits T11-T17) is generated according to bits having second highest weights in the control code FSW, and the third set of digital codes (i.e., the bits T21-T81) is generated according to bits having highest weights in the control code FSW. Therefore, the total current of the first set of current source circuits $242_1$-$242_3$, which is coupled to the first set of switches $S_{W1}$-$S_{W3}$ (which are controlled by the first set of digital codes), is lower. The total current of the second set of current source circuits $242_4$-$242_{10}$, which is coupled to the second set of switches $S_{W4}$-$S_{W10}$ (which are controlled by the second set of digital codes), is second highest. The total current of the third set of current source circuits $242_{11}$-$242_{17}$, which is coupled to the third set of switches $S_{W11}$-$S_{W17}$ (which are controlled by the third set of digital codes), is highest.

With the above configuration, when at least one switch in the first set of switches $S_{W1}$-$S_{W3}$, the second set of switches $S_{W4}$-$S_{W10}$, and the third set of switches $S_{W11}$-$S_{W17}$ is turned on (i.e., the switch is closed) according to the first set of digital codes, the second set of digital codes, and the third set of digital codes, at least one current source that is coupled to the at least one switch generates the current $I_{DAC}$ from the node N2. For example, the relation between the current $I_{DAC}$ and the bits B0-B9 can be expressed as the following table:

| B9 | B8 | B7 | B6 | B5 | B4 | B3 | B2 | B1 | $I_{DAC}$ |
|----|----|----|----|----|----|----|----|----|-----------|
| 0 | 0 | 0 | 0 | 0 | 0 | 0 | 0 | 0 | 0I |
| 0 | 0 | 0 | 0 | 0 | 0 | 0 | 0 | 1 | 1I |
| 0 | 0 | 0 | 0 | 0 | 0 | 0 | 1 | 0 | 2I |
| . | | | | | | | | | |
| 0 | 0 | 0 | 0 | 0 | 0 | 1 | 1 | 1 | 7I |
| 0 | 0 | 0 | 0 | 0 | 1 | 0 | 0 | 0 | 8I |
| 0 | 0 | 0 | 0 | 0 | 1 | 0 | 0 | 1 | 9I |
| . | | | | | | | | | |
| 0 | 0 | 0 | 1 | 1 | 1 | 1 | 1 | 1 | 63I |
| 0 | 0 | 1 | 0 | 0 | 0 | 0 | 0 | 0 | 64I |
| 0 | 0 | 1 | 0 | 0 | 0 | 0 | 0 | 1 | 65I |
| . | | | | | | | | | |
| 0 | 0 | 1 | 1 | 1 | 1 | 1 | 1 | 1 | 127I |
| 0 | 1 | 0 | 0 | 0 | 0 | 0 | 0 | 0 | 128I |
| 0 | 1 | 0 | 0 | 0 | 0 | 0 | 0 | 1 | 129I |
| . | | | | | | | | | |
| 1 | 1 | 1 | 1 | 1 | 1 | 1 | 1 | 1 | 511I |

Based on the above table, when the logic values of the bits B1-B9 are all 0, the switches $S_{W1}$-$S_{W17}$ are turned off (i.e., the switches are open-circuit). Under this condition, all current source circuits $242_1$-$242_{17}$ are disconnected from the node N2, and thus the current $I_{DAC}$ is 0I. If the logic value of the bit B1 is 1 and the logic values of the remaining bits B2-B9 are 0, the switch $S_{W1}$ is turned on, and remaining switches $S_{W2}$-$S_{W17}$ are turned off. Under this condition, the current source circuit $242_1$ is connected to the node N2 and the remaining current source circuits $242_2$-$242_{17}$ are disconnected from the node N2, and thus the current $I_{DAC}$ is 1I (i.e., the current 1I generated from the current source circuit $242_1$). If the logic value of the bit B4 is 1 and the logic values of the remaining bits B1-B3 and B5-B9 are 0, the switch $S_{W4}$ is turned on, and the remaining switches $S_{W1}$-$S_{W3}$ and $S_{W5}$-$S_{W17}$ are turned off. Under this condition, the current source circuit $242_4$ is connected to the node N2 and the remaining current source circuits $242_1$-$242_3$ and $242_5$-$242_{17}$ are disconnected from the node N2, and thus the current $I_{DAC}$ is 8I (i.e., the current 8I generated from the current source circuit $242_4$). If the logic values of the bits B1-B6 are 1 and the logic values of the remaining bits B7-B9 are 0, the switches $S_{W1}$-$S_{W10}$ are turned on, and the remaining switches $S_{W11}$-$S_{W17}$ are turned off. Under this condition, the current source circuits $242_1$-$242_{10}$ dare connected to the node N2 and the remaining current source circuits $242_{11}$-$242_{17}$ are disconnected from the node N2, and thus current $I_{DAC}$ is 63I (i.e., the current 7I generated from the current source circuits $242_1$-$242_3$, and the current 56I generated from the current sources circuits $242_4$-$242_{10}$).

If the logic value of the bit B7 is 1 and the logic values of the remaining bits B1-B6 and B8-B9 are 0, the switch $S_{W11}$ is turned on, and the remaining switches $S_{W1}$-$S_{W10}$ and $S_{W12}$-$S_{W17}$ are turned off. Under this condition, the current source circuits $242_{11}$ is connected to the node N2 and the remaining current source circuits $242_1$-$242_{10}$ and $242_{12}$-$242_{17}$ are disconnected from the node N2, and thus the current $I_{DAC}$ is 64I (which can be understood with the same analogy, and thus the repetitious operations will not be given in the following paragraphs). If the logic value of the bit B8 is 1 and the logic values of the remaining bits B1-B7 and B9 are 0, the switches $S_{W11}$-$S_{W12}$ are turned on and the remaining switches $S_{W1}$-$S_{W10}$ and $S_{W13}$-$S_{W17}$ are turned off. Under this condition, the current source circuits $242_{11}$-$242_{12}$ are connected to the node N2 and the remaining current source circuits $242_1$-$242_{10}$ and $242_{13}$-$242_{17}$ are disconnected from the node N2, and thus the current $I_{DAC}$ is 128I. By this analogy, when the logic values of all the bits B1-B9 are 1, all the switches $S_{W1}$-$S_{W17}$ are turned on. Under this condition, all the current source circuits $242_1$-$242_{17}$ are connected to the node N2, and thus the current $I_{DAC}$ is 511I.

The arrangements of the current source array circuit 240 in FIG. 2B are given for illustrative purposes, and the present disclosure is not limited thereto. According to practical design requirements, any one of the current source circuits in the current source array circuit 240 may be implemented with unity current source circuits that are coupled in parallel with each other. For example, in some embodiments, each of the current source circuits $242_{11}$-$242_{17}$ may be implemented with 8 current source circuits each having a current 8I that are coupled in parallel with each other (i.e., a total current 64I is generated).

Figure 2C:
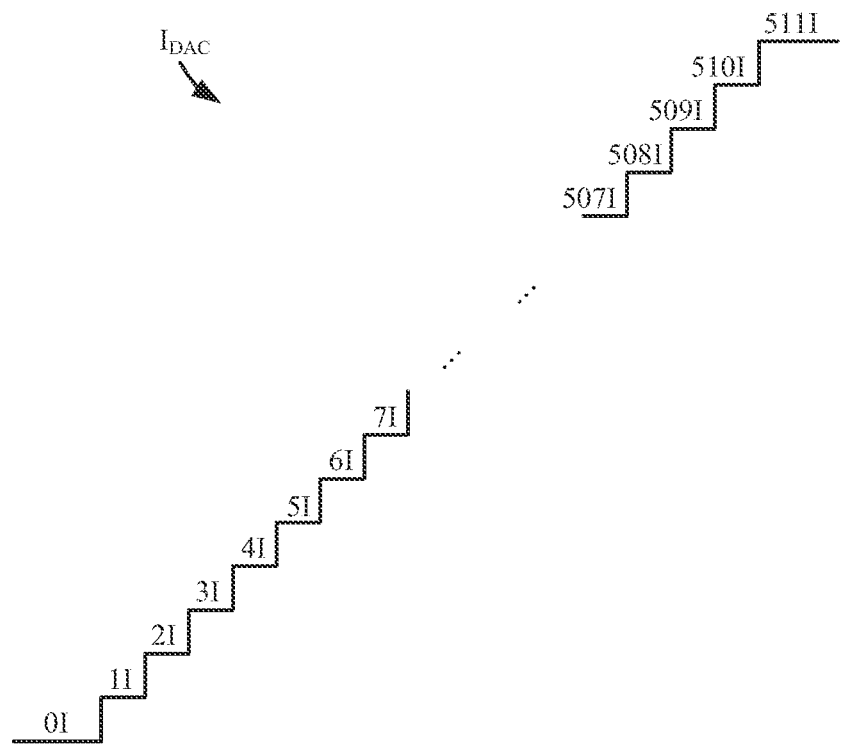
FIG. 2C is a schematic diagram of a waveform of the current in FIG. 2B according to some embodiments of the present disclosure.

FIG. 2C is a schematic diagram of a waveform of the current $I_{DAC}$ in FIG. 2B according to some embodiments of the present disclosure. As shown in FIG. 2C, with the above arrangements, the current source array circuit 240 may turn a corresponding number of current source circuit(s) in response to the control code FSW, in order to gradually adjust the current $I_{DAC}$ (e.g., 0I-511I, which are 512 steps for adjustment). As a result, according to the above equation (1), the boost converter circuit 120 may increase the output voltage Your gradually and linearly, in order to prevent the overshoot voltage or the undershoot voltage. Accordingly, the sensitivity of the diode D2 can be kept stable, in order to address deficiency in related approaches.

Figure 3:
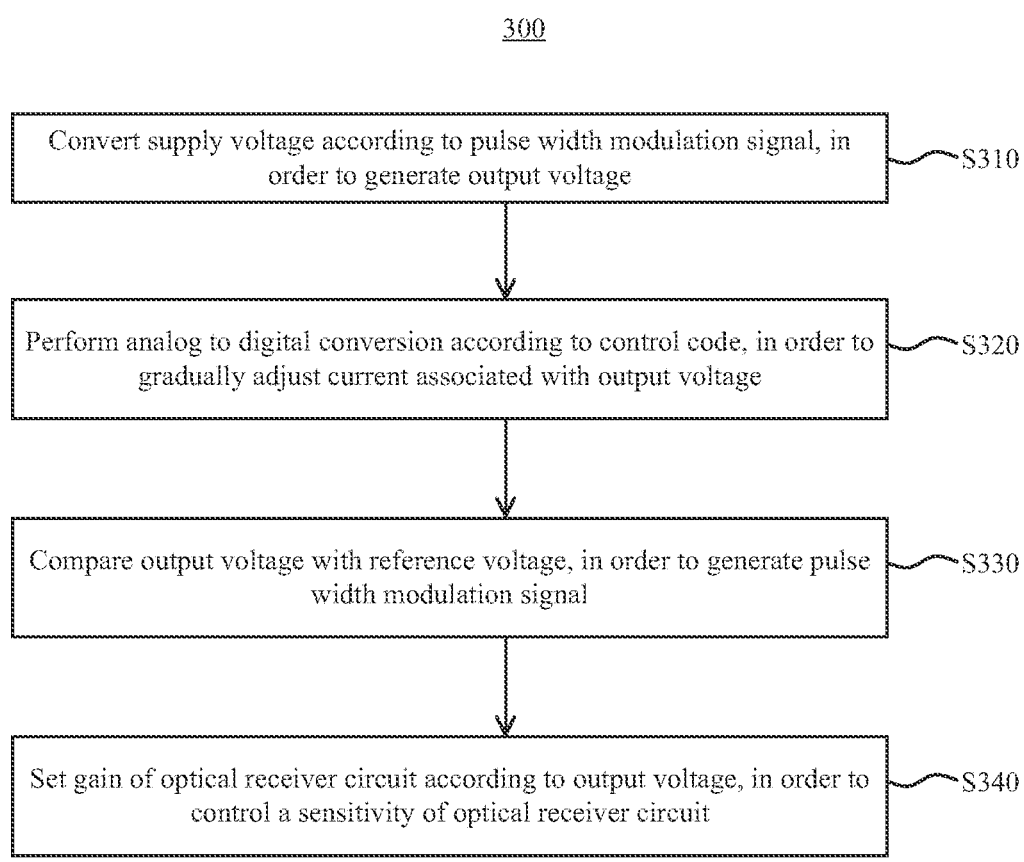
FIG. 3 is a flow chart of a sensitivity control method according to some embodiments of the present disclosure.

FIG. 3 is a flow chart of a sensitivity control method 300 according to some embodiments of the present disclosure. In some embodiments, the sensitivity control method 300 may be (but not limited to) performed by the boost converter circuit 120 and the PWM controller circuitry 160 in FIG. 1.

In operation S310, a supply voltage is converted according to a pulse width modulation signal, in order to generate an output voltage. In operation S320, a digital to analog conversion is performed according to a control code, in order to gradually adjust a current associated with the output voltage. In operation S330, the output voltage is compared with a reference voltage, in order to generate the pulse width modulation signal. In operation S340, a gain of an optical receiver circuit is set according to the output voltage, in order to control a sensitivity of the optical receiver circuit.

The above operations of the sensitivity control method 300 can be understood with reference to various embodiments discussed above, and thus the repetitious descriptions are not given. The above description of the sensitivity control method 300 includes exemplary operations, but the operations are not necessarily performed in the order described above. Operations of the sensitivity control method 300 may be added, replaced, changed order, and/or eliminated as appropriate, or the operations are able to be executed simultaneously or partially simultaneously as appropriate, in accordance with the spirit and scope of various embodiments of the present disclosure.

As described above, with the optical receiver device, the PWM controller circuitry, and the sensitivity control method provided in some embodiments of the present disclosure, the boost converter may gradually and linearly increase the output voltage that is configured to control an optical receiver circuit based on operations of the digital to analog conversion. As a result, the overshoot voltage and the undershoot voltage are avoided, in order to keep the sensitivity of the optical receiver circuit stable.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An optical receiver device, comprising:
   a boost converter circuit configured to convert a supply voltage according to a pulse width modulation signal, in order to generate an output voltage;
   an optical receiver circuit configured to set a gain according to the output voltage, in order to convert an optical signal to be a data signal according to the gain; and
   a pulse width modulation controller circuitry configured to perform a digital to analog conversion according to a control code to gradually adjust a current associated with the output voltage, and to compare the output voltage with a reference voltage to generate the pulse width modulation signal.

2. The optical receiver device of claim 1, wherein the pulse width modulation controller circuitry comprises:
   a feedback circuit configured to generate a feedback voltage according to the output voltage;
   a digital to analog converter circuit configured to perform the digital to analog conversion according to the control code, in order to generate the current;
   an error amplifier circuit configured to generate an error signal according to the feedback voltage and a reference voltage;
   a comparator circuit configured to compare the error signal with a saw signal, in order to generate a reset signal; and a latch circuit configured to generate the pulse width modulation signal according to a set signal and the reset signal.

3. The optical receiver device of claim 2, wherein the digital to analog converter circuit comprises:
a plurality of encoder circuits configured to generate a plurality of sets of digital codes according to the control code; and
a current source array circuit configured to be selectively turned on according to the plurality of sets of digital codes, in order to generate the current.

4. The optical receiver device of claim 3, wherein the current source array circuit comprises:
a plurality of sets of switches configured to be controlled by the plurality of sets of digital codes respectively; and
a plurality of sets of current source circuits coupled to the plurality of sets of switches respectively,
wherein when at least one switch in the plurality of sets of switches is turned on according to the plurality of sets of digital codes, at least one current source circuit, which is coupled to the at least one switch, in the plurality of sets of current source circuits generates the current.

5. The optical receiver device of claim 4, wherein the plurality of sets of current source circuits comprise:
a first set of current source circuits coupled to a first set of switches in the plurality of sets of switches, wherein the first set of switches is controlled by a first set of digital codes in the plurality of sets of digital codes;
a second set of current source circuits coupled to a second set of switches in the plurality of sets of switches, wherein the second set of switches is controlled by a second set of digital codes in the plurality of sets of digital codes; and
a third set of current source circuits coupled to a third set of switches in the plurality of sets of switches, wherein the third set of switches is controlled by a third set of digital codes in the plurality of sets of digital codes,
wherein a current of a current source circuit in the third set of current source circuits is higher than a total current of the second set of current source circuits, and a current of a current source circuit in the second set of current source circuits is higher than a total current of the first set of current source circuits.

6. The optical receiver device of claim 3, wherein the plurality of encoder circuits comprise:
a first encoder circuit configured to generate a plurality of bits according to the control code, wherein a first portion of the plurality of bits is a first set of digital codes in the plurality of sets of digital codes;
a second encoder circuit configured to generate a second set of digital codes in the plurality of sets of digital codes according to a second portion of the plurality of bits; and
a third encoder circuit configured to generate a third set of digital codes in the plurality of sets of digital codes according to a third portion of the plurality of bits.

7. The optical receiver device of claim 6, wherein each of the control code, the second set of digital codes, and the third set of digital codes is a thermometer code, and the plurality of bits are a binary code.

8. The optical receiver device of claim 3, wherein the plurality of sets of digital codes comprise a first set of digital codes, a second set of digital codes, and a third set of digital codes, the first set of digital codes is generated based on bits having lower weights in the control code, and the second set of digital codes and the third set of digital codes are generated based on bits having higher weights in the control code.

9. A pulse width modulation controller circuitry, comprising:
a feedback circuit configured to generate a feedback voltage according to an output voltage, wherein the output voltage is generated by a boost converter circuit according to a pulse width modulation signal;
a digital to analog converter circuit configured to perform a digital to analog conversion according to a control code, in order to gradually adjust a current associated with the output voltage, wherein when the current is higher, the output voltage is higher; and
a modulator circuitry configured to generate the pulse width modulation signal according to the feedback voltage.

10. The pulse width modulation controller circuitry of claim 9, wherein the digital to analog converter circuit comprises:
a plurality of encoder circuits configured to generate a plurality of sets of digital codes according to the control code; and
a current source array circuit configured to be selectively turned on according to the plurality of sets of digital codes, in order to generate the current.

11. The pulse width modulation controller circuitry of claim 10, wherein the current source array circuit comprises:
a plurality of sets of switches configured to be controlled by the plurality of sets of digital codes respectively; and
a plurality of sets of current source circuits coupled to the plurality of sets of switches respectively,
wherein when at least one switch in the plurality of sets of switches is turned on according to the plurality of sets of digital codes, at least one current source circuit, which is coupled to the at least one switch, in the plurality of sets of current source circuits generates the current.

12. The pulse width modulation controller circuitry of claim 11, wherein the plurality of sets of current source circuits comprises:
a first set of current source circuits coupled to a first set of switches in the plurality of sets of switches, wherein the first set of switches is controlled by a first set of digital codes in the plurality of sets of digital codes;
a second set of current source circuits coupled to a second set of switches in the plurality of sets of switches, wherein the second set of switches is controlled by a second set of digital codes in the plurality of sets of digital codes; and
a third set of current source circuits coupled to a third set of switches in the plurality of sets of switches, wherein the third set of switches is controlled by a third set of digital codes in the plurality of sets of digital codes,
wherein a current of a current source circuit in the third set of current source circuits is higher than a total current of the second set of current source circuits, and a current of a current source circuit in the second set of current source circuits is higher than a total current of the first set of current source circuits.

13. The pulse width modulation controller circuitry of claim 10, wherein the plurality of sets of digital codes comprise a first set of digital codes, a second set of digital codes, and a third set of digital codes, the first set of digital codes is generated based on bits having lower weights in the control code, and the second set of digital codes and the third set of digital codes are generated based on bits having higher weights in the control code.

14. The pulse width modulation controller circuitry of claim 10, wherein the plurality of encoder circuits comprise:
   a first encoder circuit configured to generate a plurality of bits according to the control code, wherein a first portion of the plurality of bits is a first set of digital codes in the plurality of sets of digital codes;
   a second encoder circuit configured to generate a second set of digital codes in the plurality of sets of digital codes according to a second portion of the plurality of bits; and
   a third encoder circuit configured to generate a third set of digital codes in the plurality of sets of digital codes according to a third portion of the plurality of bits.

15. The pulse width modulation controller circuitry of claim 14, wherein each of the control code, the second set of digital codes, and the third set of digital codes is a thermometer code, and the plurality of bits are a binary code.

16. A sensitivity control method, comprising:
   converting a supply voltage according to a pulse width modulation signal, in order to generate an output voltage;
   performing a digital to analog conversion according to a control code, in order to gradually adjust a current associated with the output voltage;
   comparing the output voltage with a reference voltage, in order to generate the pulse width modulation signal; and
   setting a gain of an optical receiver circuit according to the output voltage, in order to control a sensitivity of the optical receiver circuit.

17. The sensitivity control method of claim 16, wherein performing the digital to analog conversion according to the control code, in order to gradually adjust the current associated with the output voltage comprises:
   generating a plurality of sets of digital codes according to the control code; and
   selectively turning on a current source array circuit according to the plurality of sets of digital codes, in order to generate the current.

18. The sensitivity control method of claim 17, wherein the plurality of sets of digital codes comprise a first set of digital codes, a second set of digital codes, and a third set of digital codes, the first set of digital codes is generated based on bits having lower weights in the control code, and the second set of digital codes and the third set of digital codes are generated based on bits having higher weights in the control code.

19. The sensitivity control method of claim 17, wherein the current source array circuit comprises a plurality of sets of switches and a plurality of sets of current source circuits, and selectively turning on the current source array circuit according to the plurality of sets of digital codes comprises:
   controlling a corresponding set of switches in the plurality of sets of switches according to a corresponding set of digital codes in the plurality of sets of digital codes; and
   generating, by at least one current source circuit in the plurality of sets of current source circuits, the current when at least one switch in the plurality of sets of switches is turned on according to the plurality of sets of digital codes, wherein the at least one current source circuit is coupled to the at least one switch.

20. The sensitivity control method of claim 19, wherein controlling the corresponding set of switches in the plurality of sets of switches according to the corresponding set of digital codes in the plurality of sets of digital codes comprises:
   controlling a first set of switches in the plurality of sets of switches according to a first set of digital codes in the plurality of sets of digital codes, wherein the first set of switches is coupled to a first set of current source circuits in the plurality of sets of current source circuits;
   controlling a second set of switches in the plurality of sets of switches according to a second set of digital codes in the plurality of sets of digital codes, wherein the second set of switches is coupled to a second set of current source circuits in the plurality of sets of current source circuits; and
   controlling a third set of switches in the plurality of sets of switches according to a third set of digital codes in the plurality of sets of digital codes, wherein the third set of switches is coupled to a third set of current source circuits in the plurality of sets of current source circuits,
   wherein a current of a current source circuit in the third set of current source circuits is higher than a total current of the second set of current source circuits, and a current of a current source circuit in the second set of current source circuits is higher than a total current of the first set of current source circuits.

* * * * *